(12) United States Patent
Poll et al.

(10) Patent No.: US 10,774,433 B2
(45) Date of Patent: Sep. 15, 2020

(54) ELECTROCHEMICAL RECYCLING OF LEAD-BASED MATERIALS

(71) Applicant: Imperial Innovations Limited, London (GB)

(72) Inventors: Christopher Gavin Poll, London (GB); David Jason Riley, London (GB); David James Payne, London (GB)

(73) Assignee: IMPERIAL WHITE CITY INCUBATOR LIMITED, London (GB)

( * ) Notice: Subject to any disclaimer, the term of this patent is extended or adjusted under 35 U.S.C. 154(b) by 0 days.

(21) Appl. No.: 15/735,453

(22) PCT Filed: Jun. 9, 2016

(86) PCT No.: PCT/GB2016/051704
§ 371 (c)(1),
(2) Date: Dec. 11, 2017

(87) PCT Pub. No.: WO2016/198872
PCT Pub. Date: Dec. 15, 2016

(65) Prior Publication Data
US 2018/0179650 A1 Jun. 28, 2018

(30) Foreign Application Priority Data

Jun. 12, 2015 (GB) .................... 1510316.1

(51) Int. Cl.
| | | |
|---|---|---|
| C25B 1/00 | (2006.01) | |
| C25B 15/00 | (2006.01) | |
| C25C 1/18 | (2006.01) | |
| C22B 3/00 | (2006.01) | |
| H01M 6/52 | (2006.01) | |
| H01M 10/54 | (2006.01) | |
| C25C 7/00 | (2006.01) | |
| H01L 51/42 | (2006.01) | |

(52) U.S. Cl.
CPC .............. *C25C 1/18* (2013.01); *C22B 13/045* (2013.01); *C25C 7/00* (2013.01); *H01M 6/52* (2013.01); *H01M 10/54* (2013.01); *H01L 51/4226* (2013.01); *Y02P 10/212* (2015.11); *Y02W 30/84* (2015.05)

(58) Field of Classification Search
CPC .. C25B 1/00; C25B 15/00; C25C 7/00; C25C 1/18; C25C 7/02; C25D 3/34
USPC ................................ 205/412, 299, 369, 597
See application file for complete search history.

(56) References Cited

U.S. PATENT DOCUMENTS

| | | | |
|---|---|---|---|
| 2004/0097755 A1 | 5/2004 | Abbott et al. | |
| 2013/0186862 A1* | 7/2013 | Pearson | .................... C25C 1/10 216/83 |
| 2014/0008238 A1* | 1/2014 | Zhou | ........................ C25C 3/34 205/367 |

FOREIGN PATENT DOCUMENTS

| | | |
|---|---|---|
| CN | 102703719 A | 10/2012 |
| CN | 103643262 A | 3/2014 |
| CN | 104131312 A | 11/2014 |
| EP | 1 324 979 B1 | 11/2006 |

OTHER PUBLICATIONS

Ru et al. (Nov. 2014) "Effects of existence form and concentration of PbO on the conductivity of choline chloride-urea deep eutectic solvent," J. Mol. Liquids. 199:208-214.
Smith et al. (Oct. 10, 2014) "Deep Eutectic Solvents (DESs) and Their Applications," Chemical Reviews. 114 (21):11060-11082.
International Search Report with Written Opinion corresponding to International Patent Application No. PCT/GB2016/051704, dated Aug. 23, 2016.
Search and Examination Report corresponding to Great Britain Patent Application No. 1510316.1, dated Mar. 15, 2016.

* cited by examiner

*Primary Examiner* — Zulmariam Mendez
(74) *Attorney, Agent, or Firm* — Brian C. Trinque; Lathrop GPM LLP

(57) ABSTRACT

The present application relates to the electrochemical extraction of lead (Pb) from a lead-containing material using a deep eutectic solvent. This is of particular use in the recycling of the lead-based materials that result from energy generation processes.

19 Claims, 12 Drawing Sheets

ELECTROCHEMICAL RECYCLING OF LEAD-BASED MATERIALS

This application is a 35 U.S.C. § 371 filing of International Application No. PCT/GB2016/051704, filed on Jun. 9, 2016, which claims priority from Great Britain patent application number 1510316.1 filed Jun. 12, 2015. The entire contents of these applications are incorporated by reference herein, in their entirety.

FIELD OF THE INVENTION

This invention relates to the electrochemical extraction of lead (Pb) from a lead-containing material. This invention is particularly useful for the recycling of the lead-based materials that result from energy generation processes, such as the waste products from lead acid batteries and spent lead perovskite solar cells.

BACKGROUND TO THE INVENTION

The lead acid battery is one of the most commonly used batteries in the world and is present in almost all petrol- and diesel-based motor vehicles. Lead acid batteries are also extensively used in the electric vehicle industry and as back-up energy systems for buildings such as hospitals. Due both to the toxicity of lead and its material value it is important that these batteries are recycled.

The recycling of lead batteries involves treatment of the paste and electrodes from the lead battery in order to separate the lead from the other battery components. This may involve physical separation techniques as well as chemical techniques such as hydrometallurgical processing, smelting and electrochemical processes. Electrochemical processes are preferred as they tend to result in extraction of lead in a purer form, with fewer impurities. Electrochemical processes also avoid the need for heating materials to very high temperatures, which is costly. Additional costs are also involved in the transport of spent lead acid batteries to centralised smelting facilities.

However, currently known electrochemical processes can be problematic as complex mixtures of chemicals are required to dissolve lead in a form suitable for treatment in an electrochemical cell. These chemicals are also very toxic as they are generally very concentrated acids and, thus, they are difficult to handle and require special safety precautions.

Lead(II) sulphate ($PbSO_4$) and lead(IV) oxide ($PbO_2$) are of vital importance in lead acid batteries. The charged lead acid battery has one electrode of Pb and one of $PbO_2$, whilst the discharged battery has two electrodes of $PbSO_4$. Thus, the ability to recycle $PbSO_4$ and $PbO_2$ from a spent lead acid battery is desirable.

Moreover, it is not only lead from lead acid batteries that require new methods for recycling. The emerging technologies of lead telluride thermoelectrics and lead perovskite solar cells show potential as key lead-based materials in the developing renewable energy landscape. These technologies, however, are often considered to be limited due to their reliance on toxic lead, and the subsequent risk of environmental damage when these devices reach the end of their working life. Currently there is no clear recycling technique for these materials. In the case of lead perovskite photovoltaics this is often considered to be one of the key limiting factors in their scale up and introduction to the marketplace. As lead is toxic the end of life issues for lead perovskite solar cells are pertinent. Three of the most commonly used and promising materials in the field of lead perovskite photovoltaics are $CH_3NH_3PbI_3$ ($MAPbI_3$), $HC(NH_2)_2PbI_3$ ($FAPbI_3$) and $CH_3NH_3PbI_{3-X}Cl_X$ ($MAPbI_{3-X}Cl_X$). Through the safe and environmentally friendly recycling of lead perovskite solar cells, the issue surrounding the toxicity and pollution at the end of their working life can be overcome and these materials will be able to have a wider application in the marketplace.

Thus, there is a need for an improved process for recovering lead from the lead-based materials used in, for example, lead batteries and solar cells.

SUMMARY OF THE INVENTION

It has been determined that an electrochemical recycling process involving the use of a deep eutectic solvent (DES) can be used to recycle lead-based materials. The electrochemical recycling of lead involves an electrochemical process to extract the lead from the lead-based material. The extracted lead may then be used in new lead products. Accordingly, in a first aspect, the invention provides a method for extracting lead from a lead-based material, the method comprising:

dissolving the lead-based material in a deep eutectic solvent to form an electrolyte;
providing a working electrode in electrical contact with the electrolyte;
providing a counter electrode; and
generating a potential through the electrolyte, thereby reducing a lead species of the lead-based material in the electrolyte at the working electrode so as to deposit the reduced lead species as lead metal;
wherein the lead-based material is selected from $PbO_2$, $PbSO_4$, $CH_3NH_3PbHaI_3$ ($MAPbHaI_3$), $HC(NH_2)_2Pb$-$HaI_3$ ($FAPbHaI_3$), $CH_3NH_3PbI_{3-X}Cl_X$ ($MAPbI_{3-X}Cl_X$) or PbTe, or a mixture thereof.

The working electrode may be a metal electrode, preferably a lead electrode or an indium tin oxide electrode, preferably a lead electrode (for example a lead foil electrode).

The lead species may be reduced at the working electrode and the reduced lead species may be deposited as lead metal on the working electrode.

The deep eutectic solvent may comprise a hydrogen bond donor and a quaternary ammonium salt, preferably ethylene glycol and choline chloride, or urea and choline chloride, preferably wherein the ethylene glycol:choline chloride, or urea:choline chloride are present in a molar ratio of 2:1.

The lead species may deposited on the working electrode when a potential equal to, or more negative than, the Pb(II) to Pb reduction potential is applied.

The deep eutectic solvent may be maintained at a temperature above about 20° C. during the method for extracting lead from a lead-based material, preferably the deep eutectic solvent may be maintained at a temperature of about 20 to about 100° C., about 40 to about 80° C., about 50 to about 70° C. or about 60° C.

The method for extracting lead from a lead-based material of the invention may comprise:

dissolving the lead-based material in a deep eutectic solvent to form the electrolyte;
providing a working electrode in electrical contact with the electrolyte;
providing a counter electrode in electrical contact with the electrolyte;
generating a potential through the electrolyte, thereby reducing the lead species of the lead-based material in the electrolyte at the working electrode so as to deposit the reduced lead species as lead metal on the working electrode; and collecting the deposited lead metal.

The method for extracting lead from a lead-based material of the invention may further comprise washing the deposited lead material with water and/or an organic solvent (for example, isopropanol, ethanol or acetone). The washing may comprise rinsing and/or soaking the collected deposited lead with or in the water or organic solvent, and optionally, drying the deposited lead, preferably using a $N_2$ gas flow. Washing may be carried out before or after collection of the deposited lead metal.

The counter electrode may be a metal electrode, preferably an $IrO_2$-coated Ti electrode.

The method may further comprise providing a reference electrode in electrical contact with the electrolyte, preferably wherein the reference electrode is a metal electrode, preferably an Ag-wire quasi-reference electrode.

The lead-based material may be dissolved in the deep eutectic solvent at a temperature above about 20° C. to form the electrolyte, preferably at about 20 to about 100° C., about 40 to about 80° C. or about 60° C.

The discussion of the deep eutectic solvent, the lead-based material and the electrodes in relation to the first aspect of the invention applies to all aspects and embodiments of the invention as described herein, mutatis mutandis.

In a second aspect, the invention provides the use of a deep eutectic solvent in the electrochemical extraction of lead from a lead-based material, wherein the lead-based material is selected from $PbO_2$, $PbSO_4$, $MAPbHaI_3$, $FAPbHaI_3$, $MAPbI_{3-x}Cl_x$ or $PbTe$, or a mixture thereof.

The deep eutectic solvent may comprise a hydrogen bond donor and a quaternary ammonium salt, preferably ethylene glycol and choline chloride, or urea and choline chloride, preferably wherein the ethylene glycol:choline chloride, or urea:choline chloride are present in a molar ratio of 2:1.

In a third aspect, the invention provides an electrochemical cell capable of reducing a lead species in a lead-based material so that the reduced lead species is deposited at a working electrode, the cell comprising:

an electrolyte comprising a solution of the lead-based material dissolved in a deep eutectic solvent;

a working electrode in electrical contact with the electrolyte;

a counter electrode in electrical contact with the electrolyte;

wherein the lead-based material is selected from $PbO_2$, $PbSO_4$, $MAPbHaI_3$, $FAPbHaI_3$, $MAPbI_{3-x}Cl_x$ or $PbTe$, or a mixture thereof.

The working electrode in the electrochemical cell may be a metal electrode, preferably a lead electrode or an indium tin oxide electrode, preferably a lead electrode. The counter electrode in the electrochemical cell may be a metal electrode, preferably an $IrO_2$-coated Ti electrode.

The electrochemical cell may further comprise a reference electrode in electrical contact with the electrolyte. Preferably the reference electrode is a metal electrode, preferably an Ag-wire quasi-reference electrode.

The deep eutectic solvent may comprise a hydrogen bond donor and a quaternary ammonium salt, preferably ethylene glycol and choline chloride, or urea and choline chloride, preferably wherein the ethylene glycol:choline chloride, or urea:choline chloride are present in a molar ratio of 2:1.

The electrolyte may be maintained a temperature above about 20° C., preferably about 20 to about 100° C., about 40 to about 80° C., about 50 to about 70° C. or about 60° C.

The lead-based material may be dissolved in the deep eutectic solvent at a temperature above about 20° C. to form the electrolyte, preferably at about 20 to about 100° C., about 40 to about 80° C., about 50 to about 70° C. or about 60° C.

In a fourth aspect, the invention provides method for extracting lead from a lead-based material, the method comprising:

dissolving the lead-based material in a deep eutectic solvent to form an electrolyte;

providing a working lead electrode in electrical contact with the electrolyte;

providing at least one further electrode in electrical contact with the electrolyte; and generating a potential through the electrolyte, thereby reducing a lead species of the lead-based material in the electrolyte at the working electrode so as to deposit the reduced lead species as lead metal.

Embodiments described herein in relation to the first aspect of the invention apply mutatis mutandis to the second and the fourth aspects of the invention.

DETAILED DESCRIPTION OF THE INVENTION

Figure 1:
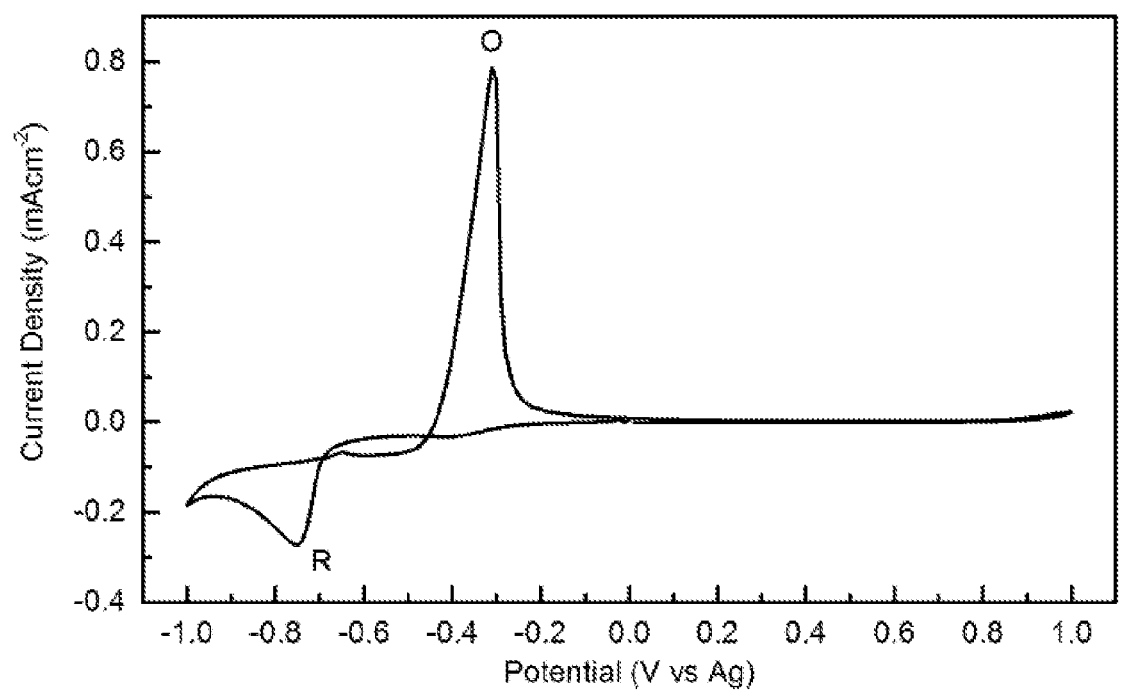
FIG. 1 shows a cyclic voltammogram (CV) of an indium tin oxide (ITO) working electrode in a $PbSO_4$ DES. The reduction peak R is attributed to Pb(II) to Pb reduction and deposition on the ITO, whilst O is an oxidative stripping processes.

It has been determined that deep eutectic solvents may be used to electrochemically recycle lead-based materials. These lead-based materials may particularly be used in or result from energy generating processes, and these waste lead-based materials may be recycled into new lead products. Recycling of lead-based materials to produce lead involves the electrochemical extraction of lead from the lead-based material. Lead is extracted in the form of lead metal and may then be subjected to further processing steps before it may be used in new products. Alternatively, the lead may be extracted in a form that avoids the need for further processing steps, so it may be directly used in new products.

Extraction of lead is achieved by dissolving the lead-based material in the deep eutectic solvent, and then selectively electrodepositing the lead onto an electrode. Accordingly, in a first aspect, the invention provides a method for extracting lead from a lead-based material, the method comprising:
  dissolving the lead-based material in a deep eutectic solvent to form an electrolyte;
  providing a working electrode in electrical contact with the electrolyte;
  providing a counter electrode; and
  generating a potential through the electrolyte, thereby reducing a lead species of the lead-based material in the electrolyte at the working electrode so as to deposit the reduced lead species at lead metal;
  wherein the lead-based material is selected from PbO$_2$, PbSO$_4$, CH$_3$NH$_3$PbHal$_3$ (MAPbHal$_3$), HC(NH$_2$)$_2$PbHal$_3$ (FAPbHal$_3$), CH$_3$NH$_3$PbI$_{3-x}$Cl$_x$ (MAPbI$_{3-x}$Cl$_x$) or PbTe, or a mixture thereof.

Use of a working lead electrode in the recycling of lead from a lead-based material allows deposited reduced lead to be collected along with the electrode, avoiding the need for additional processing steps to separate the lead from the electrode. Accordingly, in another aspect, the invention provides method for extracting lead from a lead-based material, the method comprising:
  dissolving the lead-based material in a deep eutectic solvent to form an electrolyte;
  providing a working lead electrode in electrical contact with the electrolyte;
  providing a counter electrode in electrical contact with the electrolyte; and
  generating a potential through the electrolyte, thereby reducing a lead species of the lead-based material in the electrolyte at the working electrode so as to deposit the reduced lead species as lead metal.

A deep eutectic solvent (DES) is an ionic solvent that is a mixture of two or more components forming a eutectic with a melting point lower than either of the individual components. Compared to ordinary solvents, deep eutectic solvents also have a low volatility, are non-flammable, are relatively inexpensive to produce, and may be biodegradable. It has been found that deep eutectic solvents may be particularly useful in the solvation of lead-based materials and subsequent electrochemical extraction of lead from these lead-based materials.

Deep eutectic solvents may be formed from a mixture of a quaternary ammonium salt (for example, choline chloride) and a hydrogen bond donor (for example, amides, alcohols or carboxylic acids). Thus, DES may be a type III DES. Particularly useful quaternary ammonium salts are quaternary ammonium halides (preferably chlorides). Quaternary ammonium salts include choline chloride (2-hydroxyethyltrimethylammonium chloride), N-ethyl-2-hydroxy-N,N-dimethylethanaminium chloride, 2-(chlorocarbonyloxy)-N,N,N-trimethylethanaminium chloride or N-benzyl-2-hydroxy-N,N-dimethylethanaminium chloride. Particularly useful hydrogen bond donors include alcohols (such as ethylene glycol and glycerol), amides (such as urea, acetamide, 1-methyl urea, 1,3-dimethyl urea, 1,1-dimethyl urea, thiourea and benzamide), and carboxylic acids (such as malonic acid, benzoic acid, adipic acid, oxalic acid, succinic acid and citric acid), preferably a hydrogen bond donor is ethylene glycol or urea. Exemplary DES include systems formed of a mixture of an alcohol hydrogen bond donor and a quaternary ammonium salt in a 2:1 molar ratio, an amide hydrogen bond donor and a quaternary ammonium salt in a 2:1 molar ratio, or a carboxylic acid hydrogen bond donor and a quaternary ammonium salt in a 1:1 molar ratio. Preferable DES include systems formed of a mixture of ethylene glycol and choline chloride (preferably in a 2:1 molar ratio), or urea and choline chloride (preferably in a 2:1 molar ratio). Further exemplary hydrogen bond donors, quaternary ammonium salt and DES systems include those set out in E L Smith et al., Chemical Reviews, 114(21), 11060-11082, 2014, the contents of which are herein incorporated by reference.

The invention concerns the extraction of lead from lead-based materials. A lead-based material of the present invention is material containing a lead compound, i.e. a material comprising lead and at least one additional element. The lead-based material may be a lead salt, in particular a lead(II) or lead(IV) salt. The lead-based materials described herein may particularly be used in or result from energy generating processes such as those carried out in batteries or solar cells or resulting from thermoelectric processes. As used herein, the term 'lead species' relates to the lead ions of the particular lead-based material. Preferably the lead species is Pb(II) (alternative notation Pb$^{2+}$), or Pb(IV) (Pb$^{4+}$). Exemplary lead-based materials are compounds that contain Pb(II) or Pb(IV), such as those including the lead acid battery materials lead(II) sulfate (PbSO$_4$), lead(IV) oxide (PbO$_2$) and lead(II) oxide (PbO), the lead perovskite photovoltaic materials CH$_3$NH$_3$PbHal$_3$ (MAPbHal$_3$), HC(NH$_2$)$_2$PbHal$_3$ (FAPbHal$_3$), CH$_3$NH$_3$PbI$_{3-x}$Cl$_x$ (MAPbI$_{3-x}$Cl$_x$) and the thermoelectric material lead telluride (PbTe), or a mixture thereof, wherein Hal is I, Cl or Br preferably I, and wherein X is a value between 0 and 3, preferably X is less than 1.5, less than 1 or less than 0.5.

Preferably the lead perovskite photovoltaic materials are $CH_3NH_3PbI_3$ ($MAPbI_3$), $HC(NH_2)_2PbI_3$ ($FAPbI_3$) or $CH_3NH_3PbI_{3-X}Cl_X$ ($MAPbI_{3-X}Cl_X$), or mixtures thereof.

The lead-based materials of the invention are dissolved in the DES before electrodeposition onto an electrode. The resulting solution of the lead-based material dissolved in the DES is used as the electrolyte in the electrochemical method for lead extraction of the invention. The lead species in the electrolyte is reduced by the potential applied to form a reduced lead species. Generating a potential through the electrolyte results in production of a current flowing through the electrolyte, thereby reducing the lead species. The reduced lead species is lead metal, i.e. Pb(0). This reduced lead species is deposited on the electrode and may then be collected. The reduction of the lead species may preferably be a Pb(II) to Pb(0) reduction. Consequently, the lead species may preferably be reduced and deposited when a potential equal to, or more negative than, the Pb(II) to Pb(0) reduction potential is applied. Therefore, it is preferable to generate a potential equal to, or more negative than, the Pb(II) to Pb(0) reduction potential through the electrolyte.

A working electrode is immersed in the electrolyte, so as to be in electrical conduct with the electrolyte, to form an electrochemical cell. An electrochemical cell is a device capable of facilitating chemical reactions through the introduction of electrical energy. The working electrode may apply the desired potential in a controlled way and facilitate the transfer of charge to and from the electrolyte.

The lead species is reduced at the working electrode and the reduced lead may be deposited onto the working electrode. Therefore, the greater the surface area of the electrode, the greater the rate of deposition. Accordingly, it is desired to use an electrode with a high surface area proportional to its volume, for example, a foil or mesh electrode.

The reduced lead may be deposited on the working electrode where it may subsequently be collected. The lead may be deposited and then delaminated from the electrode and then collected as lead separate from the electrode.

The working electrode may be a metal electrode, preferably a lead electrode or an indium tin oxide (ITO) electrode. Preferably the working electrode is a lead electrode. By electrodepositing lead onto a lead electrode, the deposited reduced lead may be collected along with the electrode as a larger piece of lead, thus the lead from the lead-based material is recycled into a larger piece of lead that is ready for use in the lead industry. This avoids the need for additional processing steps to separate the lead from the electrode. Preferably the working electrode is a lead foil electrode.

In some embodiments, after deposition of the lead, it may be beneficial to wash the deposited lead metal. This may aid in removing residual DES and avoid post-deposition oxidation of the lead material.

A counter electrode is provided in the electrochemical cell to balance the working electrode. The counter electrode, may act as the other half of the cell. This counter electrode balances the charge added or removed by the working electrode. These two electrodes, the working and counter electrodes, make up a two-electrode electrochemical cell, where the reduction and oxidation half reaction take place at the working and counter electrode, respectively. The counter electrode may be a metal electrode, preferably a $IrO_2$-coated Ti electrode.

Optionally a third electrode may be provided. Accordingly, a three-electrode cell may be used comprising the working electrode, the counter electrode and a third electrode: a reference electrode, which may act as reference in measuring and controlling the potential applied to the working electrode. These three electrodes, the working, reference and counter electrodes, make up a three-electrode electrochemical cell. When used in a three-electrode cell, the counter electrode may be a metal electrode, preferably an $IrO_2$-coated Ti electrode. When used in a three-electrode cell, the counter electrode may also be known as an auxiliary electrode. The reference electrode may be a quasi-reference electrode. The reference electrode may be a metal electrode, preferably Ag-wire quasi-reference electrode. Alternatively, a stable reference electrode may be prepared using a DES in the reference electrode.

Reference is now made to the following examples, which illustrate the invention in a non-limiting fashion.

EXAMPLES

The lead-based materials have been dissolved in the DES and the Pb firstly electrodeposited onto indium tin oxide (ITO) to demonstrate the Pb can be successfully electrodeposited onto an electrode, and secondly electrodeposited onto Pb foil for longer deposition periods to extract nearly all of the Pb from the DES. The consequence of this is that by electrodepositing Pb onto a Pb electrode, the Pb from the used lead-based material is recycled into a larger piece of Pb that is ready for use in the lead industry.

The results presented here show the successful deposition of Pb films on ITO working electrodes following the dissolution of the Pb-based materials in a DES. ITO is used as the working electrode in this case to differentiate between the deposited Pb and the substrate itself. This acts as an proof of Pb extraction and deposition using a DES for each of the lead-based materials.

Following the proof of Pb deposition on ITO, the technique has been applied more directly to lead acid battery and lead perovskite solar cell recycling. Using longer deposition times, and a Pb foil working electrode, an extraction of up to 96.4% of the Pb from dissolved $PbSO_4$ has been achieved, essentially recycling nearly all of the Pb from $PbSO_4$. The stripping of lead perovskite films on $TiO_2$-coated FTO substrates (consistent with those used in lead perovskite solar cells) has been undertaken to demonstrate that this process can be applied to lead perovskite solar cell recycling.

Example 1: Preparation of Deep Eutectic Solvent and Electrochemical Cell

The DES has been prepared by mixing the hydrogen bond donor ethylene glycol (EG) and quaternary ammonium salt choline chloride (ChCl), in a 2:1 mole ratio, at 60° C. forming a transparent, homogeneous liquid. To these specific amounts of PbSO4, $MAPbI_3$, $FAPbI_3$, $MAPbI_{3-X}Cl_X$, PbTe, and $PbO_2$ have been added, also at 60° C., and fully dissolved, or dissolved as far as possible.

Three-electrode electrochemical cells have been prepared with an Ag-wire quasi-reference electrode and $IrO_2$-coated Ti mesh counter electrode. The working electrodes used have been either indium tin oxide (ITO) or Pb foil. For all electrochemical processes the DES was maintained at 60° C. Pb electrodeposition from the DESs has been undertaken by applying a constant reduction potential, identified from cyclic voltammograms (CV), for a given amount of time. These have been undertaken on working electrodes of both ITO (to demonstrate the Pb is indeed electrodeposited from the DES), and on Pb foil for complete extraction of Pb from the DES for recycling. The working electrodes have been rinsed with isopropanol, following the depositions, to remove any residual DES. X-ray diffraction (XRD) and scanning electron microscopy (SEM) have been used to identify the Pb deposition on the working electrode.

Example 2: Lead Acid Battery Recycling

The electrodes in a discharged lead acid battery are comprised of $PbSO_4$. For this reason a $PbSO_4$ DES was prepared as in Example 1 such that a mole ratio of 2:1: 0.00057 (EG:ChCl:$PbSO_4$) was achieved with 0.6 mol EG+0.3 mol ChCl+0.17 mmol $PbSO_4$. Two separate experiments have been undertaken, firstly electrodepositing Pb on an ITO working electrode to demonstrate Pb deposition, and secondly a longer deposition on a Pb foil working electrode for complete Pb extraction from the dissolved $PbSO_4$. The $PbSO_4$ completely dissolved in the DES leaving a clear, colourless liquid.

Pb Deposition

Pb films have been electrodeposited onto ITO working electrodes in order to demonstrate that Pb can be extracted from the $PbSO_4$ DES as metallic Pb.

Figure 2:
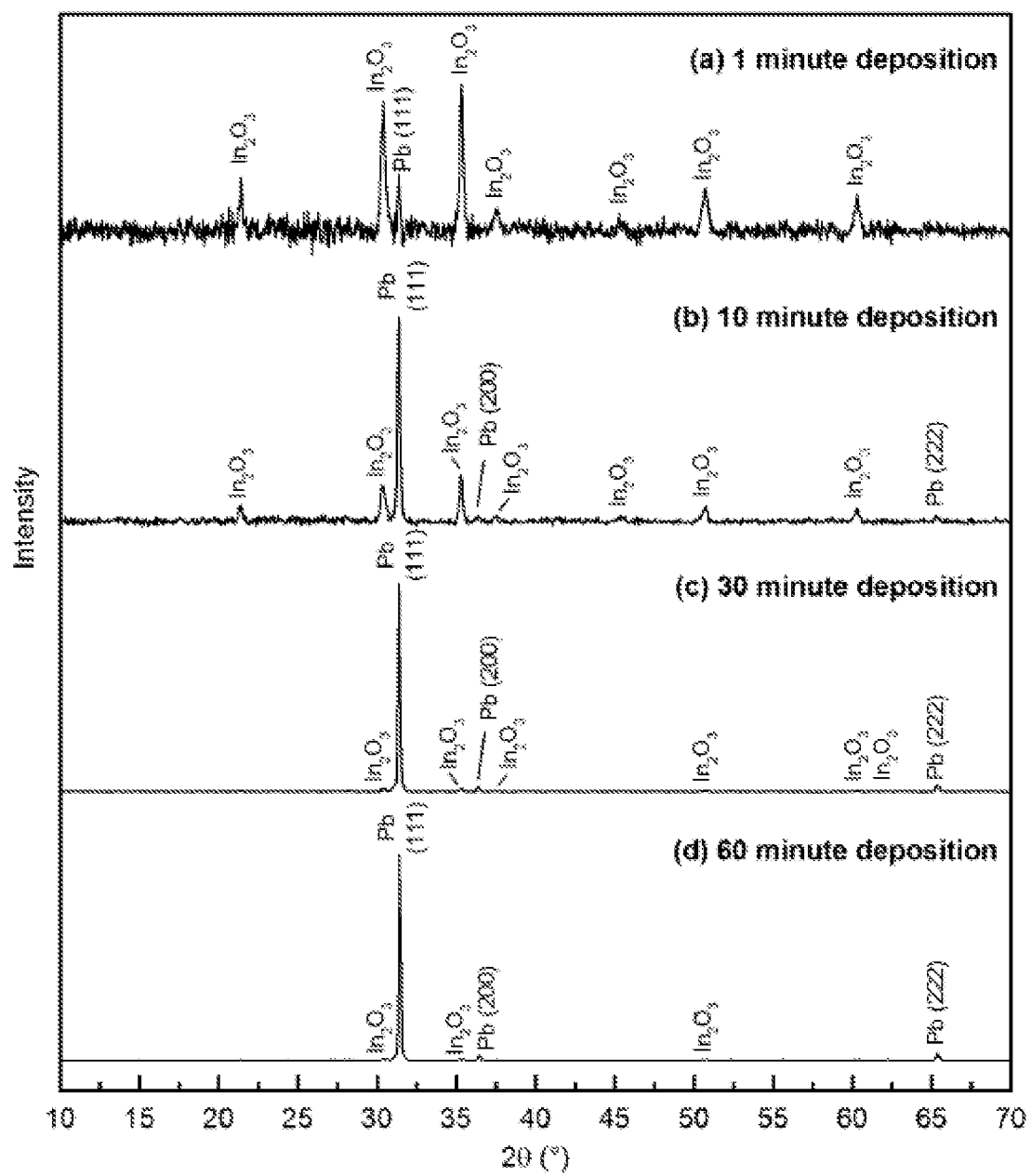
FIG. 2 shows x-ray diffraction (XRD) patterns of Pb deposited on an ITO working electrode from a $PbSO_4$ DES for (a) 1 minute, (b) 10 minutes, (c) 30 minutes and (d) 60 minutes. The diffraction peaks demonstrate that the Pb is extracted as metallic Pb.
Figure 3:
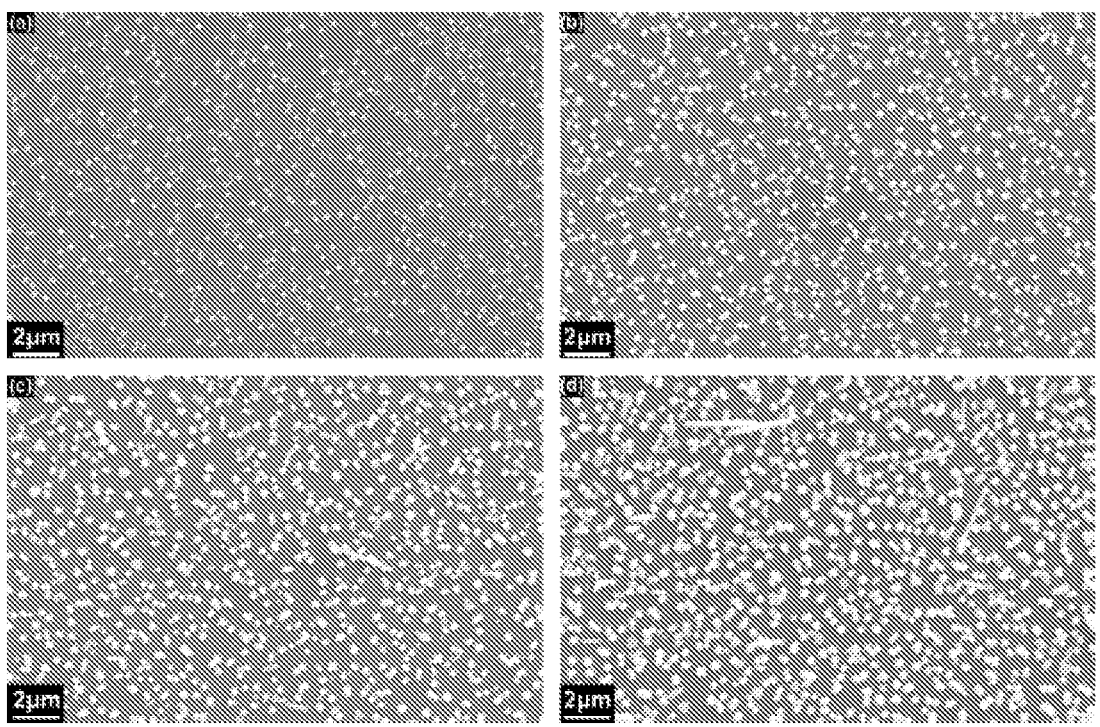
FIG. 3 shows scanning electron microscope (SEM) images of Pb deposited on an ITO working electrode from a $PbSO_4$ DES for (a) 1 minute, (b) 10 minutes, (c) 30 minutes and (d) 60 minutes. The large white particles are attributed to being Pb.

The reduction potential was identified from the CV in FIG. 1, at the peak labelled R. The peak labelled O in the CV is attributed to the deposited Pb being oxidatively stripped back into solution. Pb(II) to Pb reduction of dissolved $PbSO_4$ was undertaken at −0.75 V vs Ag, the potential of the reduction peak, for incremental times from 1 minute to 60 minutes forming even, grey films on the ITO working electrode surface. XRD patterns of these films are presented in FIG. 2, and demonstrate that Pb has been successfully electrodeposited from the DES onto the ITO working electrode. FIG. 3 shows SEM images of the Pb films, it can be seen that the Pb deposits as a series of particles which grow with increasing deposition time.

Complete Pb Extraction

Figure 4:
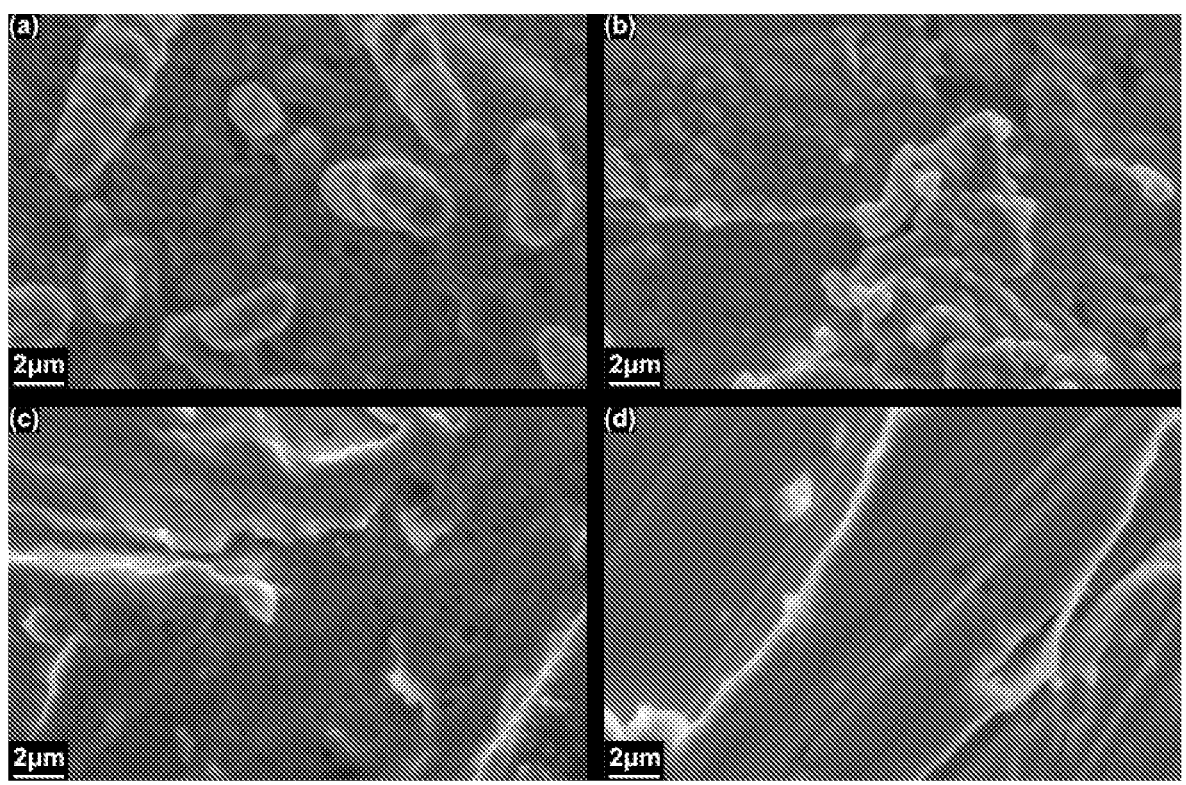
FIG. 4 shows SEM images of the Pb foil working electrode (a) following 120 hours of Pb deposition, (b) following 1 hour of Pb deposition, (c) following 120 hours of control deposition from a DES with no $PbSO_4$, (d) polished Pb foil prior to deposition.

In order to extract all of the Pb from the $PbSO_4$ DES a large area (7 $cm^2$) Pb working electrode has been used. The deposition potential for Pb has been determined using linear sweep voltammetry (LSV) to only probe the reduction region, rather than the reduction and oxidation regions probed by a CV, in order to avoid oxidising and stripping the Pb electrode itself into solution. A suitable deposition potential was determined to be −0.5 V vs Ag. A long Pb deposition was undertaken for 120 hours to extract as much Pb as possible from the DES. Additionally a 1 hour deposition was carried out to study the Pb deposition on Pb over shorter time scales. FIG. 4 shows SEM images of the Pb foil pre-deposition, following the 1 hour deposition and the 120 hour deposition. An additional control 120 hour deposition was undertaken to demonstrate that significant levels of Pb do not leach from the working electrode into solution, and to study the current-time characteristics of the current flow through the EG+ChCl.

TABLE 1

| Solution | Pb Concentration (ppm) |
|---|---|
| 0.6 mol EG + 0.3 mol ChCl + 0.17 mmol $PbSO_4$ (Pre-deposition) | 469 |
| 0.6 mol EG + 0.3 mol ChCl + 0.17 mmol $PbSO_4$ (Following 120 hour deposition) | 17 |
| 0.6 mol EG + 0.3 mol ChCl (Pre-control deposition) | 0.05 |
| 0.6 mol EG + 0.3 mol ChCl (Following 120 hour control deposition) | 0.84 |

Inductively coupled plasma optical emission spectrometry (ICP-OES) measurements have been undertaken to measure the parts per million (ppm) and calculate the percentage of Pb removed from the DES, the results of which are displayed in Table 1. 96.4% of the Pb has been extracted from the DES within the 120 hours. From the concentrations in the control deposition it can be seen that only minimal Pb has leached from the working electrode into the DES (<1 ppm).

Figure 5:
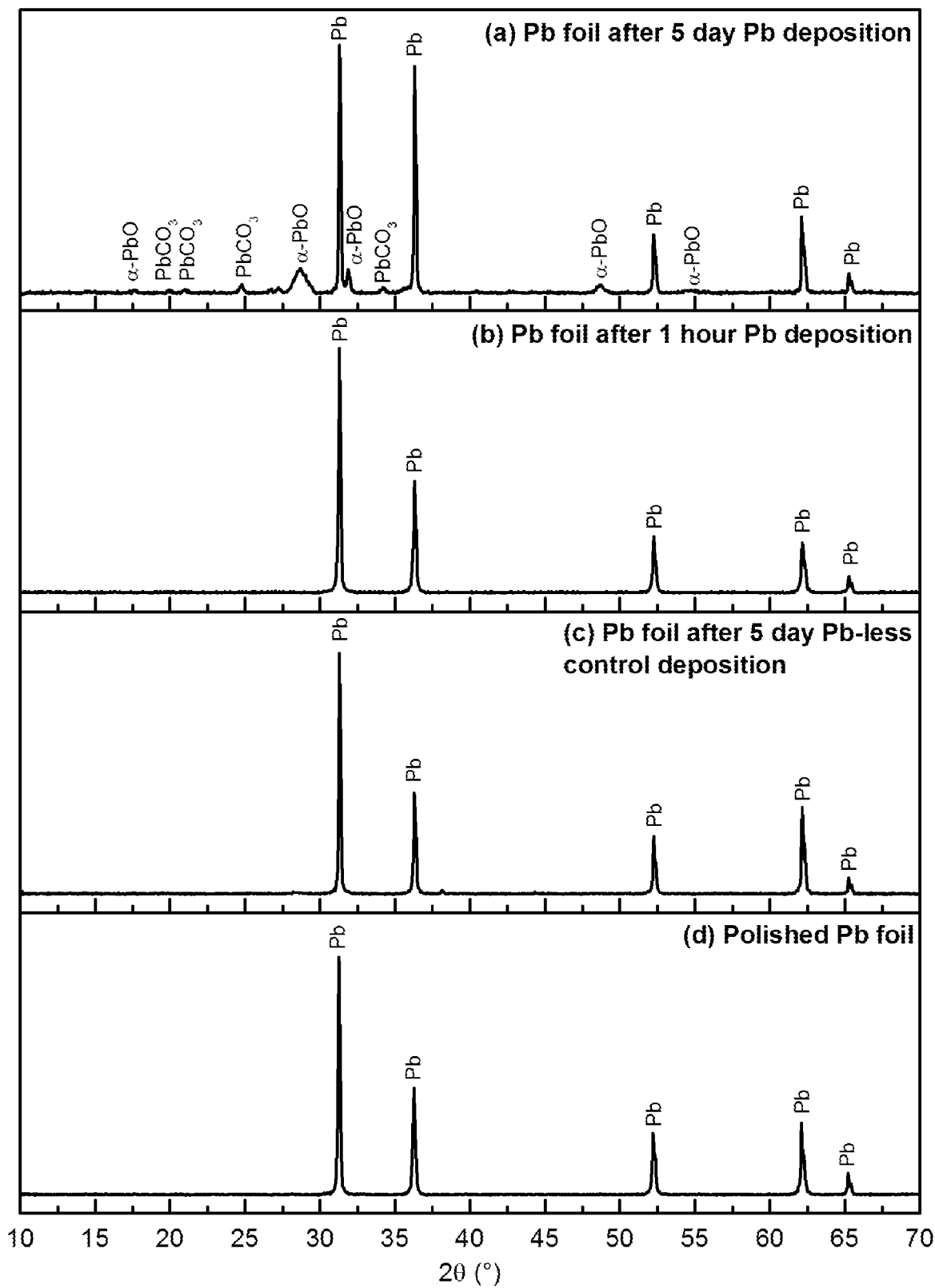
FIG. 5 shows XRD patterns of Pb foil (a) following 120 hours of Pb deposition from the $PbSO_4$ DES, (b) 1 hour of Pb deposition from the $PbSO_4$ DES, (c) 120 hours of Pb-less deposition from the control DES and (d) the polished Pb foil pre-deposition.

From the SEM images of the Pb foil pre- and post-deposition (FIG. 4) it can be seen that the Pb first deposits (after 1 hour) as a series of particles, similar to those on ITO (FIG. 3), which then grow to form much larger structures following 120 hours of deposition. The XRD patterns in FIG. 5 demonstrate that the deposition occurs as metallic Pb on the Pb foil. There is a slight addition of PbO appearing following the 120 hour deposition, this is attributed to residual DES trapped on the substrate surface causing some oxidation post-deposition and could be dealt with by rinsing following the Pb deposition.

Example 3: Lead(IV) Oxide Recycling

A DES system was prepared according to Example 1 such that the solution was comprised of 0.6 mol ethylene glycol+ 0.3 mol choline chloride+0.17 mmol $PbO_2$, at a 2:1:0.00057 mole ratio.

A three electrode electrochemical cell was prepared using with an Ag wire quasi-reference electrode and $IrO_2$-coated Ti mesh counter electrode. The working electrode used was ITO. For all electrochemical experiments, the DES was maintained at 60° C.

Pb Deposition

Figure 6:
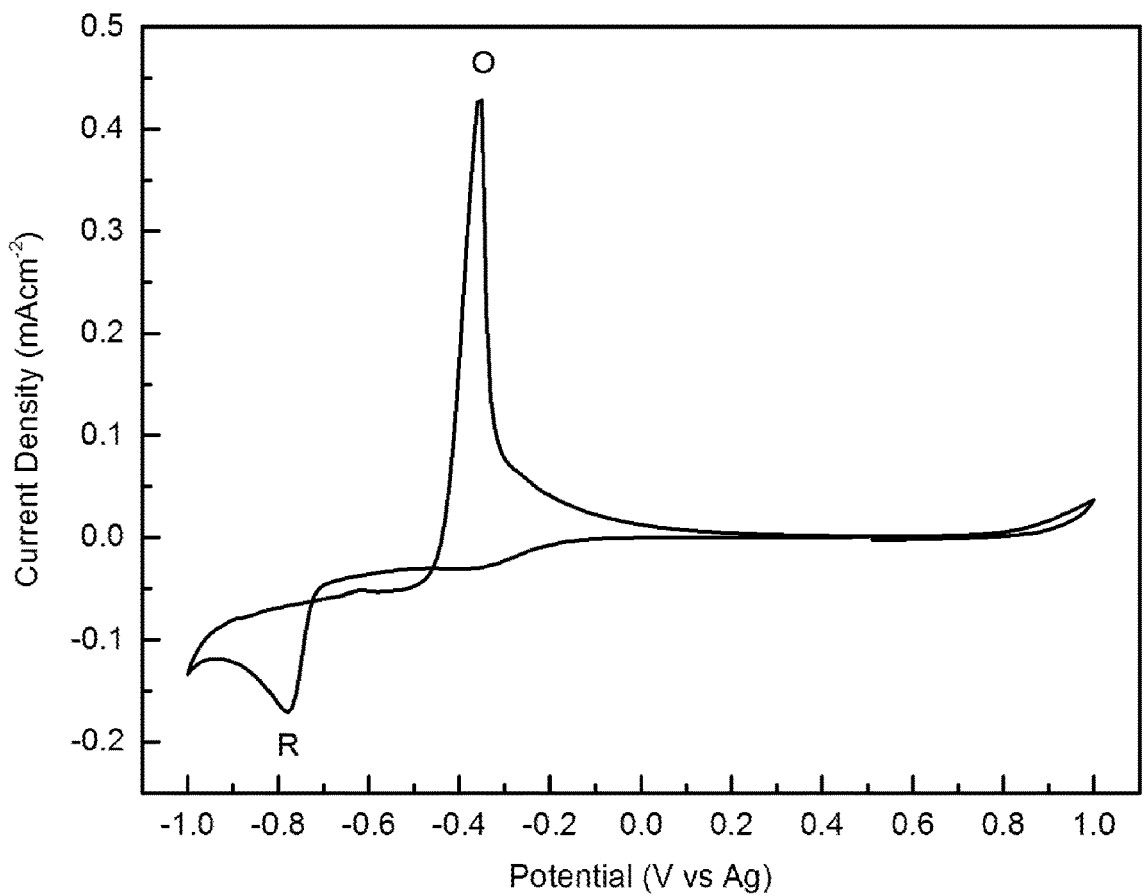
FIG. 6 shows a CV of an ITO working electrode in the $PbO_2$ DES. The reduction peak at which Pb is deposited is labelled R, whilst the oxidative stripping peak is labelled O.

A cyclic voltammogram (CV) of the ITO working electrode in the $PbO_2$ DES was recorded to identify the reduction potential at which Pb is deposited on the working electrode. The CV is displayed in FIG. 6. A reduction peak can be observed at approximately −0.78 V vs Ag.

Figure 7:
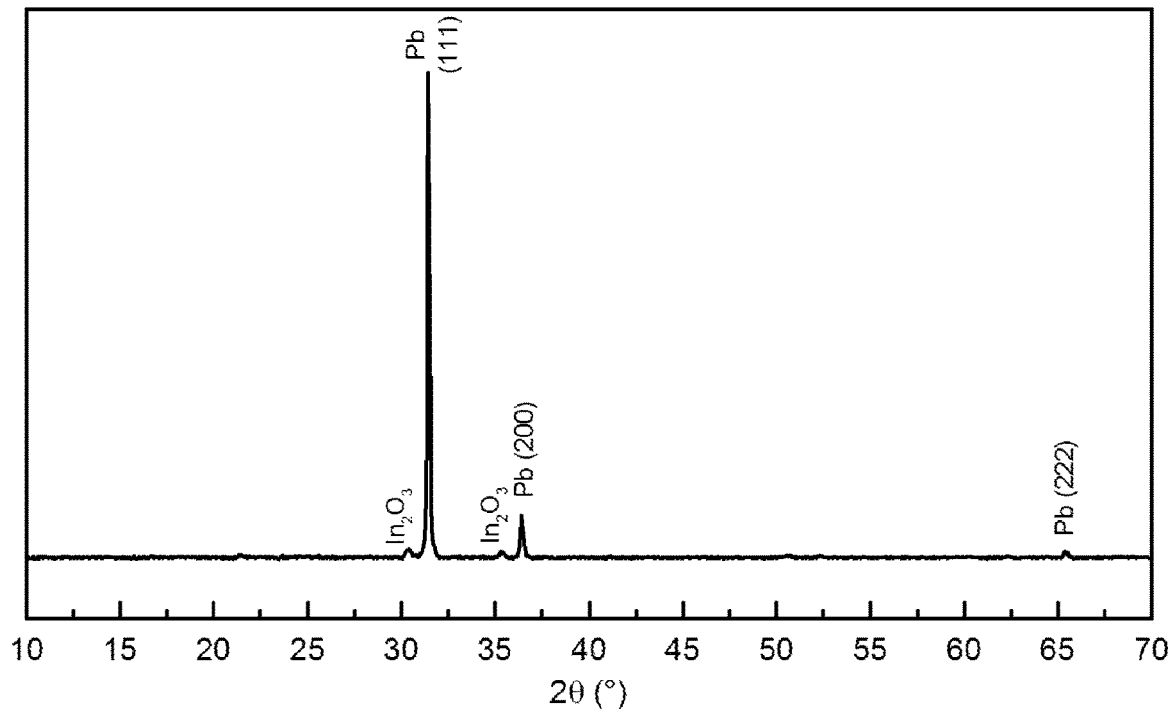
FIG. 7 shows a XRD pattern of Pb deposited potentiostatically from the $PbO_2$ DES. The peaks labelled as $In_2O_3$ are from the ITO substrate.

Pb has been potentiostatically deposited on the ITO working electrode by applying a potential of −0.9 V vs Ag for 60 minutes. This potential is used to overcome the reduction potential, whilst remaining within the electrochemical window of the ITO. Following the 60 minutes of deposition a grey film was observed on the ITO working electrode. FIG. 7 shows an x-ray diffraction (XRD) pattern of the deposited Pb, demonstrating that metallic Pb has been successfully deposited.

Figure 8:
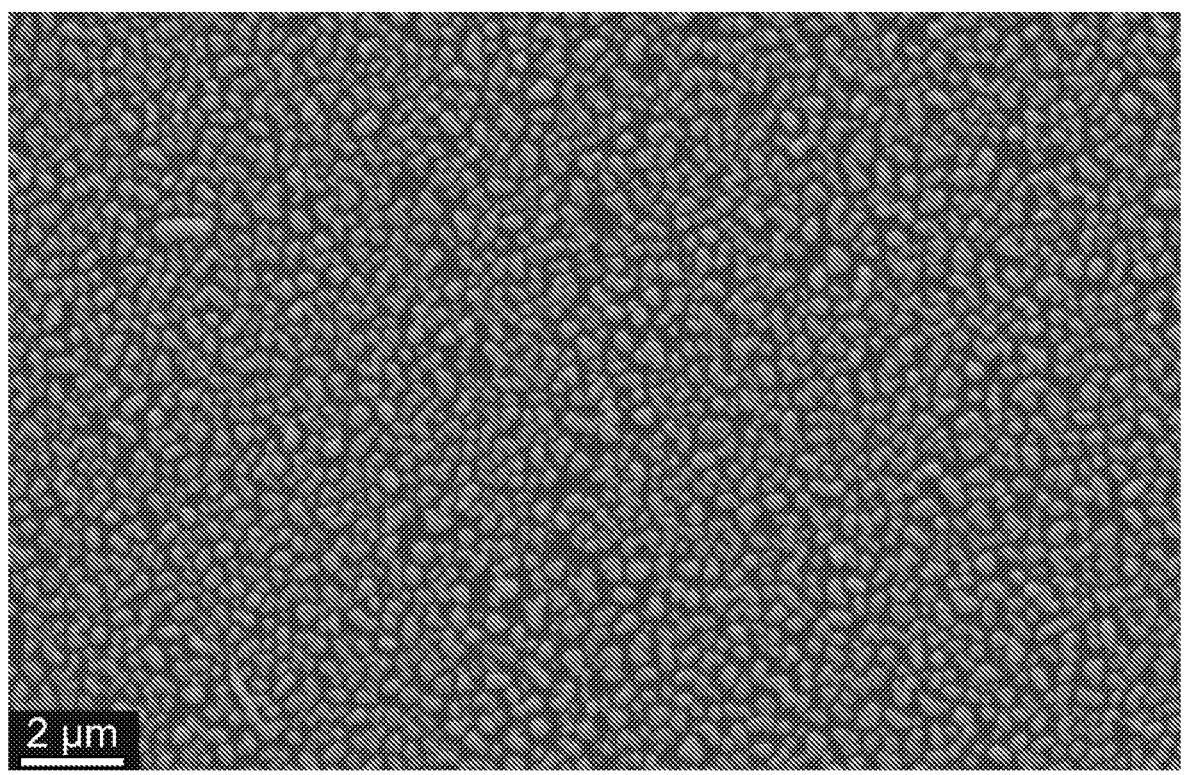
FIG. 8 shows a SEM image of Pb deposited potentiostatically from the $PbO_2$ DES.

An SEM image of the Pb film deposited from the $PbO_2$ DES is presented in FIG. 8. It can be seen that the Pb deposits as a series of particles on the ITO surface.

The deposition potential for Pb on an ITO working electrode for $PbO_2$ dissolved in an EG and ChCl DES has been identified from a CV. By applying a potential equal to, or in excess of, the reduction potential Pb has been potentiostatically deposited on the ITO surface. The deposited material has been confirmed as Pb through XRD and observed to deposit as a series of particles through SEM.

This system acts as a proof of principle that Pb can be deposited on a metallic working electrode from $PbO_2$ dissolved in a DES, and therefore the technique has application to lead-winning from spent lead acid batteries with the dissolved $PbO_2$ being electrodeposited onto Pb foil working electrode, as has previously been demonstrated for the $PbSO_4$ system.

Example 4: Lead Perovskite Photovoltaic Recycling

The recycling of lead perovskite photovoltaic materials ($MAPbI_3$, $FAPbI_3$ and $MAPbI_{3-x}Cl_x$) has been studied firstly by dissolving powdered perovskites in EG+ChCl such that a mole ratio of 2:1:0.00057 (EG:ChCl:Pb Perovskite) was achieved for consistency with the $PbSO_4$ DES. CVs have been recorded to identify the reduction potential of Pb(II) to Pb for Pb deposition on an ITO working electrode, subsequently Pb has been potentiostatically deposited on the ITO to demonstrate Pb extraction. Pb has then been potentiostatically deposited on a Pb foil working electrode to demonstrate the complete extraction of Pb from the solution.

In a lead perovskite solar cell the perovskite material is deposited on a $TiO_2$-coated FTO substrate, therefore lead perovskite films on these substrates have been stripped in the EG+ChCl DES to demonstrate how the recycling process can be applied to perovskite solar cell.

Pb Deposition

Figure 9:
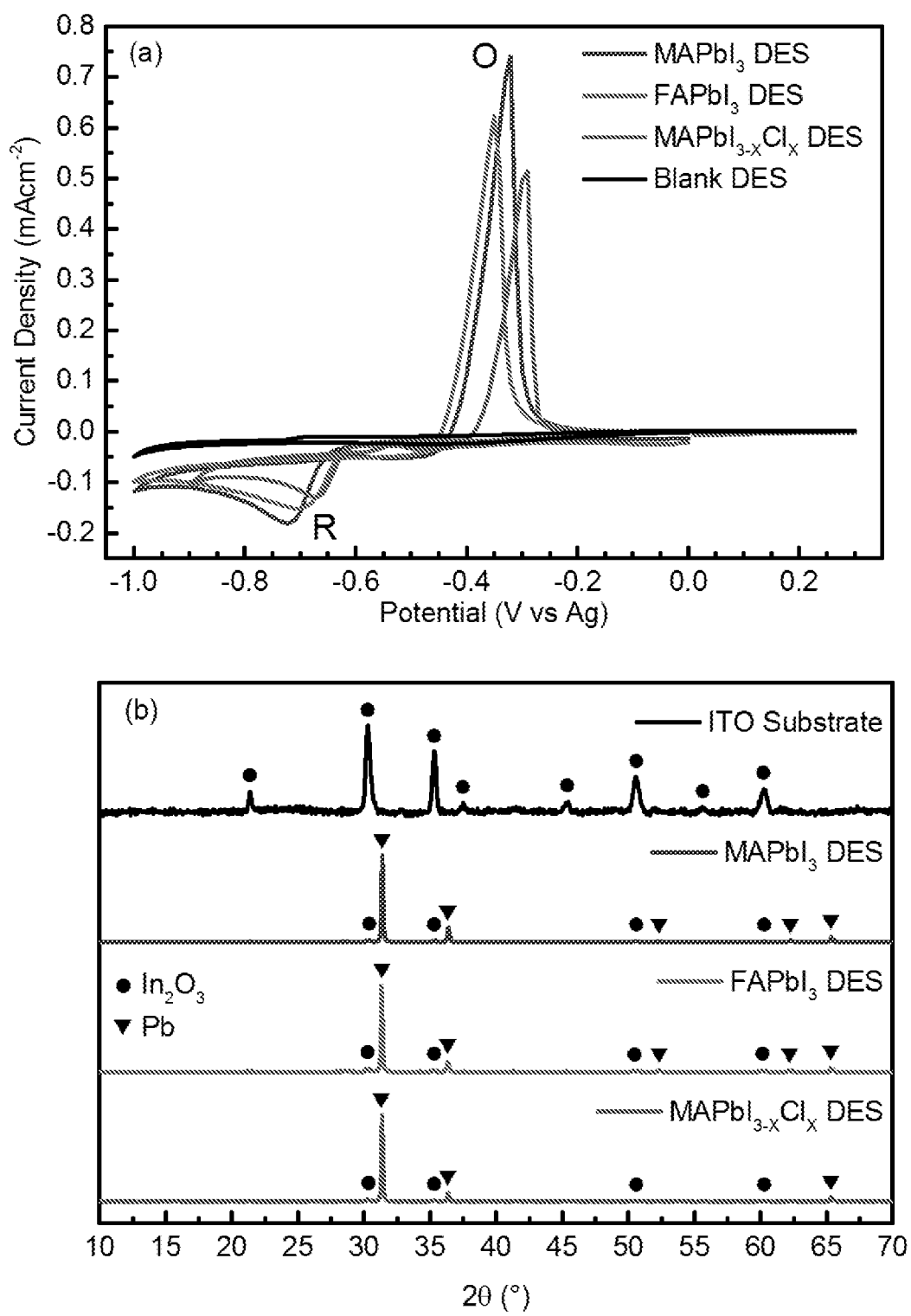
FIG. 9 shows (a) CVs of an ITO working electrode in the $MAPbI_3$, $FAPbI_3$ and $CH_3NH_3PbI_{3-x}Cl_x$ DESs, as well as a control DES containing no lead perovskite. (b) XRD patterns of a blank ITO substrate, and Pb deposited from the three perovskite DESs for one hour.

For each of the three perovskite powders, when added to the EG+ChCl DES, complete dissolution was achieved and the liquid formed a translucent yellow colour. FIG. 9 (a) shows CVs using an ITO working electrode in the DESs in which each of the lead perovskites have been dissolved, as well as a blank control DES in which no perovskite was dissolved. As with the $PbSO_4$ DES, one reduction peak (R) and one oxidation peak (O) is observed for the perovskite DESs, and in the control DES no peaks are present. The reduction and oxidation peaks are attributed to the deposition and stripping of Pb.

Potentiostatic deposition of Pb on ITO was carried out from each lead perovskite DES for 60 minutes at a potential of −0.8 V vs Ag. From each lead perovskite DES an even grey film was electrodeposited on the ITO working electrode. FIG. 9 (b) shows XRD patterns of the deposited Pb. In all cases strong Pb peaks can be observed, demonstrating that crystalline Pb has been deposited.

Figure 10:
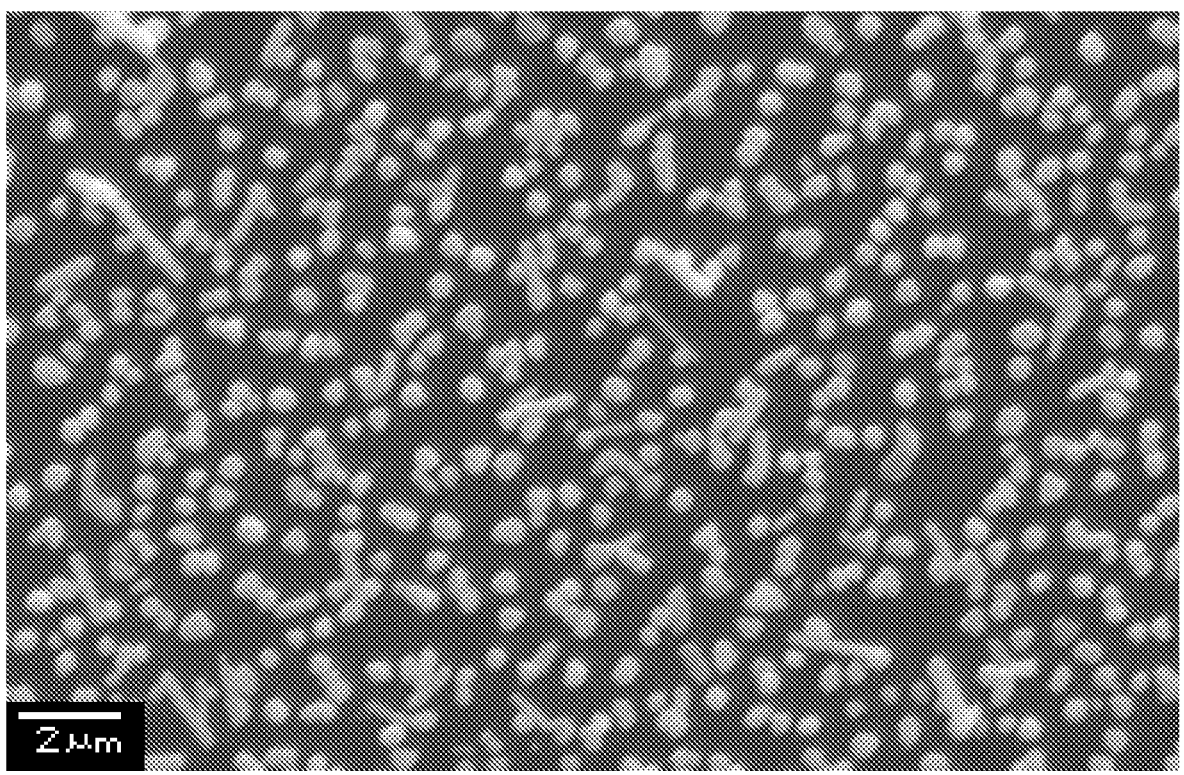
FIG. 10 shows an SEM image of Pb deposited from the $CH_3NH_3PbI_{3-x}Cl_x$ DES for 60 minutes.

FIG. 10 shows an SEM film representative of those deposited from the lead perovskite DESs, for the $MAPbI_{3-x}Cl_x$ DES, demonstrating that the Pb deposits as a series of particles on the working electrode, consistent with that observed for the $PbSO_4$ DES.

Through the combination of CVs, potentiostatic deposition and characterisation with XRD and SEM it has been demonstrated that the lead perovskites $MAPbI_3$, $FAPbI_3$ and $MAPbI_{3-x}Cl_x$ can be dissolved in an EG+ChCl DES and the Pb can be extracted through electrodeposition on a working electrode of ITO.

Complete Pb Extraction

Using a large area Pb foil working electrode, of 7.5 cm² in size, potentiostatic deposition has been undertaken on the DES solutions containing the dissolved powdered perovskites. The electrodeposition was carried out, on each solution, for 120 hours by applying a potential of −0.9 V vs Ag with the DES maintained at 60° C.

The Pb concentration in each DES was measured before and after the Pb extraction using ICP-OES analysis. The results of these measurements are displayed in Table 1.

TABLE 2

| Solution | Pb Concentration Pre-Extraction (ppm) | Pb Concentration Post-Extraction (ppm) | Percentage of Pb Removed (%) |
|---|---|---|---|
| $MAPbI_3$ DES Solution | 432.80 | 1.37 | 99.7 |
| $FAPbI_3$ DES Solution | 540.34 | 6.86 | 98.7 |
| $MAPbI_{3-x}Cl_x$ DES Solution | 616.49 | 1.43 | 99.8 |

The results demonstrate that between 98.7% and 99.8% of the Pb in solution has been successfully extracted.

Perovskite Film Stripping

The applicability of the perovskite dissolving and Pb electrodeposition technique using the DES to perovskite solar cell recycling is demonstrated by the use of films of $MAPbI_3$, $FAPbI_3$ and $MAPbI_{3-x}Cl_x$ rather than powders. The films have been prepared on $TiO_2$-coated FTO substrates (the typical structure used in perovskite solar cells) and have been held in the EG+ChCl DES at 60° C. for 30 minutes, with a gentle stirring applied. The lead perovskite films were dark brown in colour prior to dipping in the DES however once placed in the DES the dark brown colour was observed to quickly disappear as the films dissolved.

Figure 11:
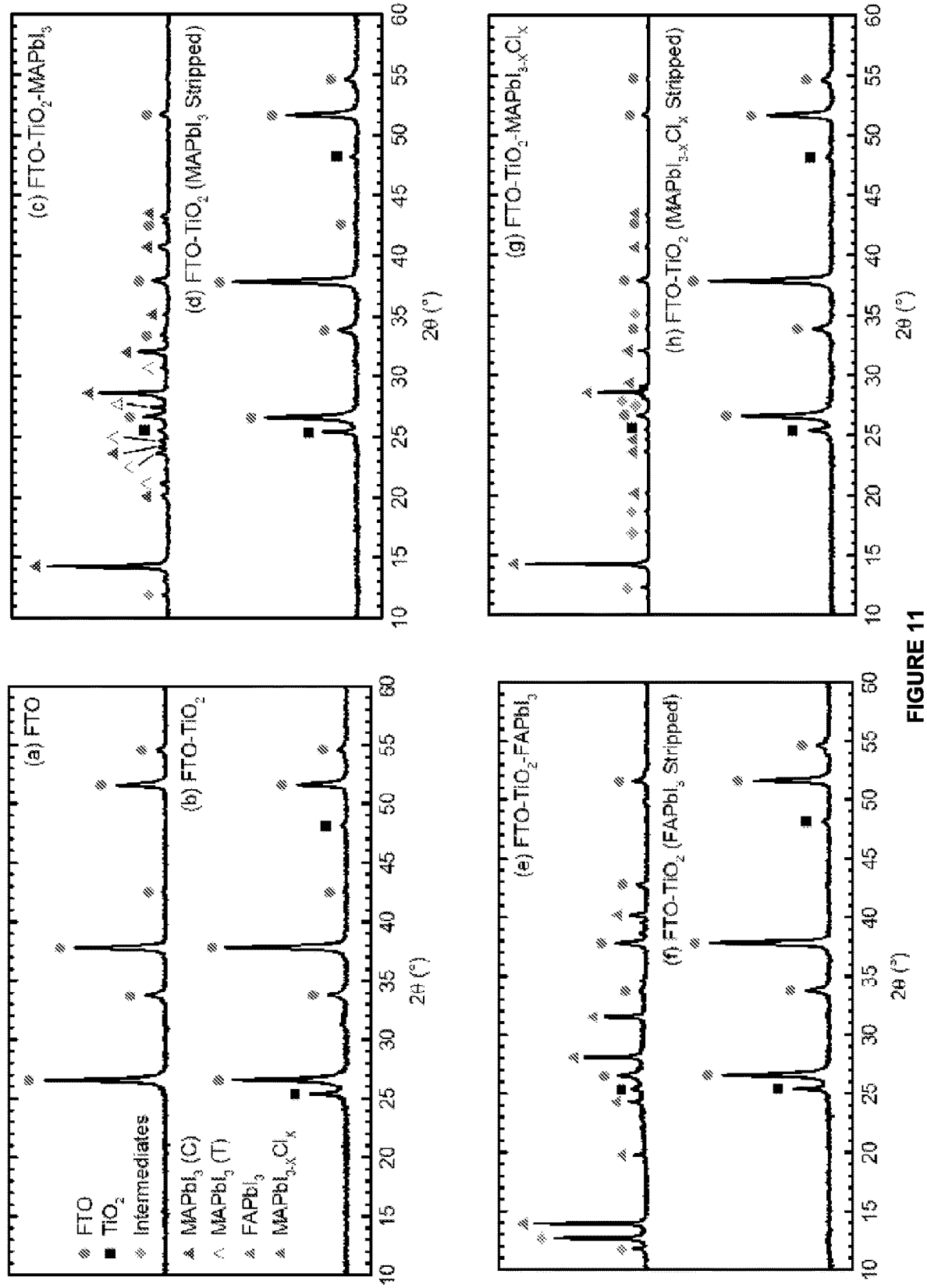
FIG. 11 shows XRD patterns of (a) the fluorine-doped tin oxide (FTO) substrate, (b) the TiO$_2$-coated FTO substrate, and on the FTO-TiO$_2$ substrates the MAPbI$_3$ film (c) before and (d) after stripping, the FAPbI$_3$ film (e) before and (f) after stripping, and the MAPbI$_{3-x}$Cl$_x$ film (g) before and (h) after stripping.

The XRD patterns in FIG. 11 show each of the perovskite films before and after stripping as well as fresh FTO and $TiO_2$-coated FTO substrates for comparison. It is clear that following 30 minutes of dissolution in the DES the perovskite films have all been completely removed, leaving only the $TiO_2$-coated FTO which itself is not dissolved. Post-stripping of the lead perovskite the $TiO_2$-coated FTO substrates have near identical XRD patterns to those prior to the deposition of the lead perovskite films.

Figure 12:
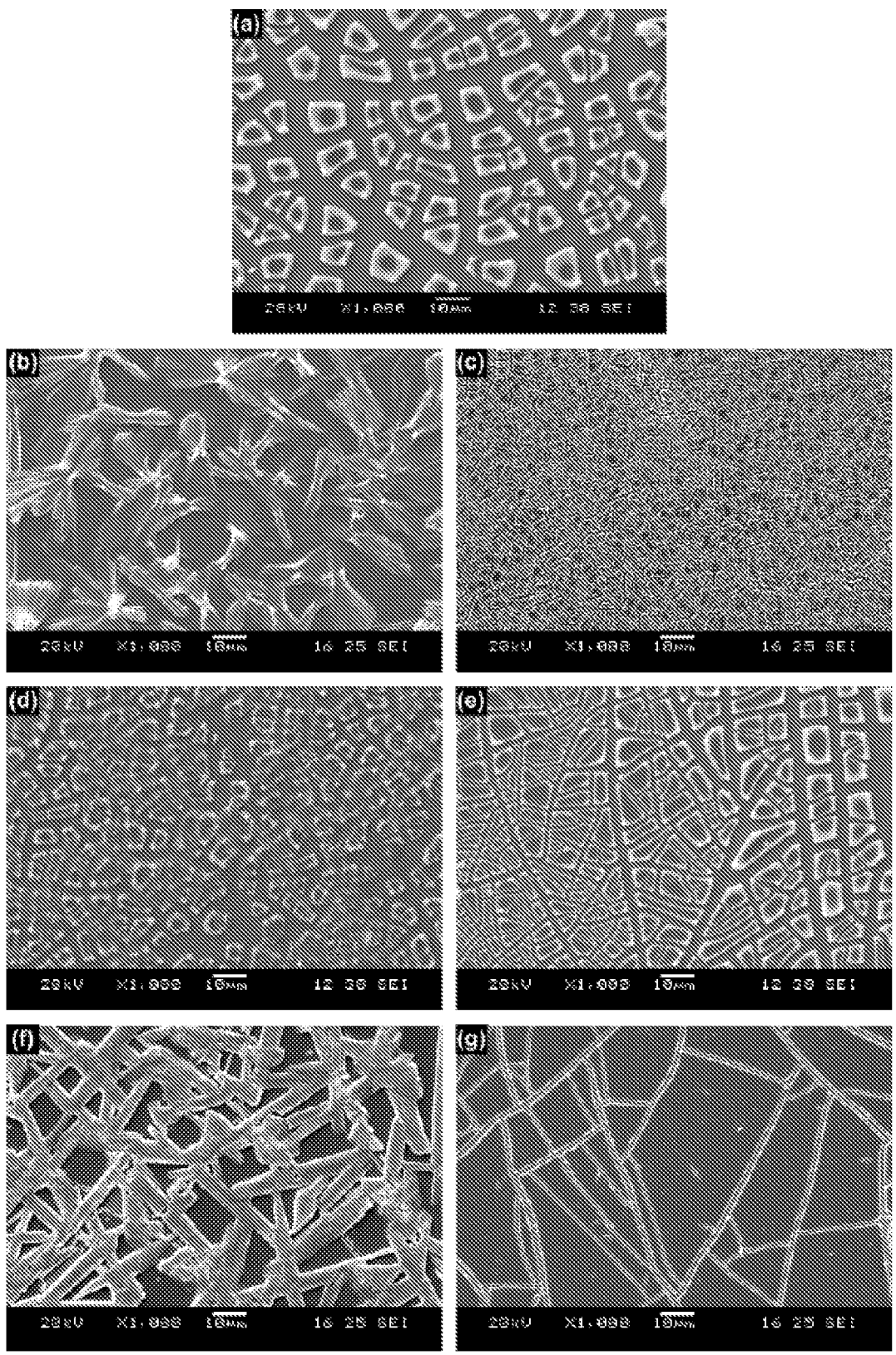
FIG. 12 shows SEM images of (a) TiO$_2$-coated FTO before the deposition of lead perovskite films, (b) and (c) MAPbI$_3$ pre- and post-stripping respectively in the DES, (d) and (e) FAPbI$_3$ pre- and post-stripping respectively in the DES, (f) and (g) MAPbI$_{3-x}$Cl$_x$ pre- and post-stripping respectively in the DES.

FIG. 12 shows SEM images of the fresh $TiO_2$-coated FTO substrate as well as each of the three perovskite films before and after stripping in the DES. In each case the perovskite film has clearly been removed leaving only the fractured crystal-like structure of the $TiO_2$-coated FTO. The visual differences in the $TiO_2$ could be due to slight differences in the fabrication of the $TiO_2$ layers before the perovskite is deposited. In any case the perovskite layer on top of the $TiO_2$ is completely removed.

The combination of the XRD and SEM results in FIGS. 11 and 12 demonstrate that the lead perovskite films can be completely removed from the $TiO_2$-coated FTO substrates allowing for the safe recycling of the Pb and the re-use of the $TiO_2$-coated FTO in new solar cells.

Example 5: Lead Telluride Thermoelectric Recycling

Powdered PbTe was added to the EG+ChCl such that a DES of 0.6 mol EG+0.3 mol ChCl+0.17 mmol PbTe was produced, maintaining the 2:1:0.00057 mole ratio used throughout. After several hours of heating stirring at 60° C. the DES had formed a white colour due to incomplete dissolution of the PbTe.

Figure 13:
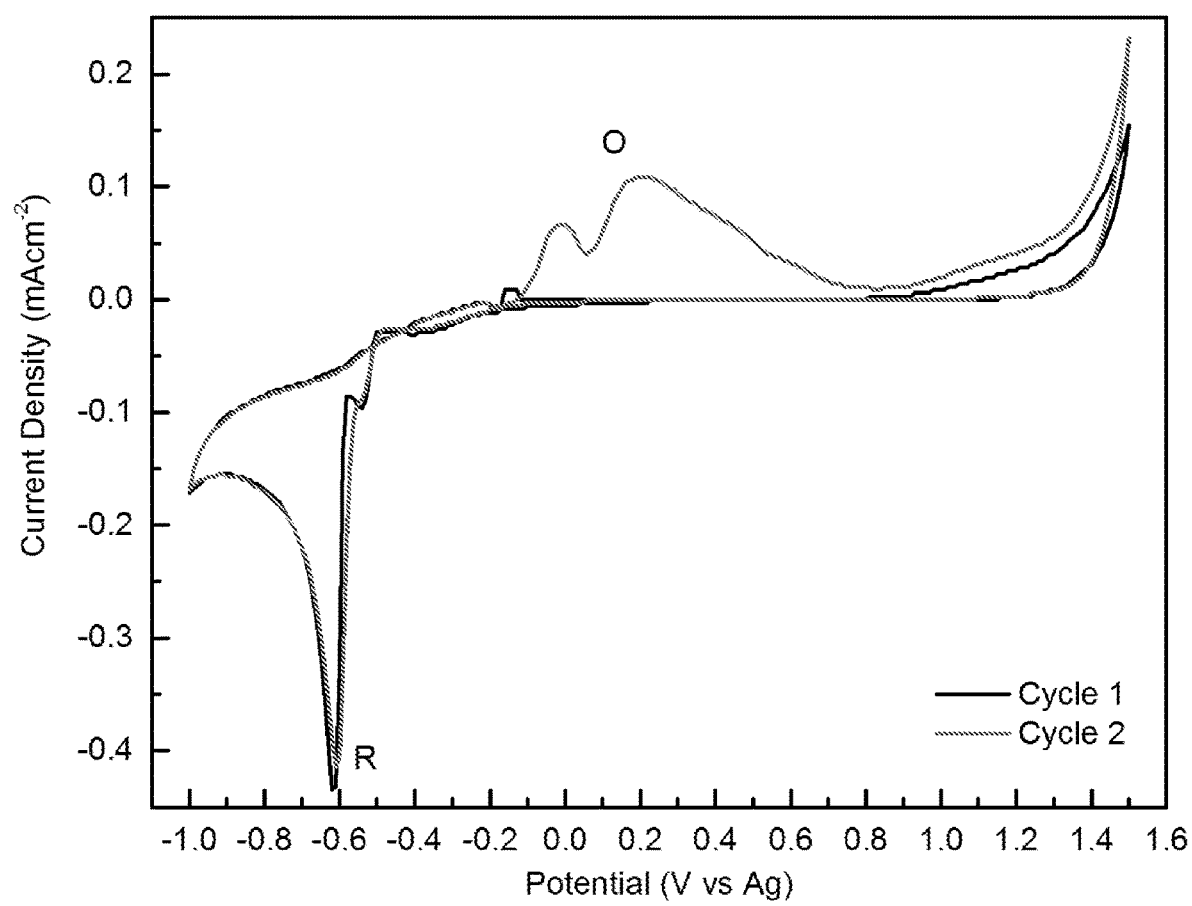
FIG. 13 shows CVs of ITO working electrodes in a PbTe DES.
Figure 14:
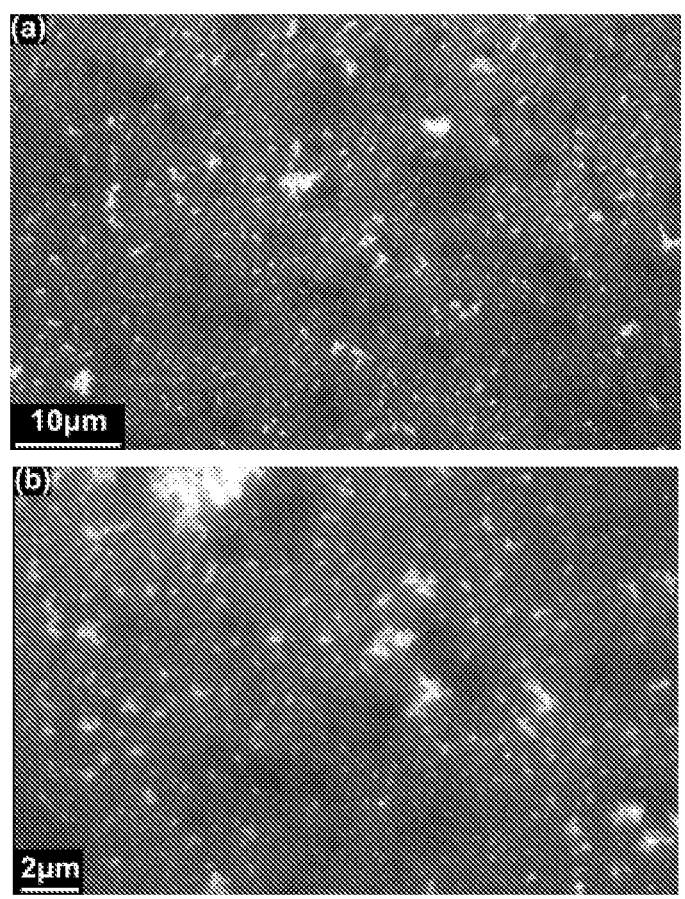
FIG. 14 shows SEM images of films of Pb potentiostatically deposited from 0.6 mol EG+0.3 mol ChCl+0.17 mmol PbTe for 180 minutes at (a) 2,000× and (b) 5,500× magnification.

A CV of the DES was recorded using an ITO working electrode (displayed in FIG. 13) which demonstrates a reduction peak (R) similar to those from the $PbSO_4$ and lead perovskite DESs, which is likely to be dissolved Pb(II) reducing to Pb at the ITO surface. A double oxidation peak (O) is observed which is due to the oxidation of the reduction product formed at R, this is demonstrated in the first cycle of the CV where the oxidation potential is swept through before the reduction potential and no peaks occur as the reduced species has not yet formed.

Potentiostatic deposition was carried out at −0.62 V vs Ag for 60 minutes and 180 minutes. Some black material formed on the ITO surface, which delaminated when rinsing away the residual DES. SEM images (FIG. 15) indicated some Pb deposition.

Embodiments of the invention have been described by way of example only. It will be appreciated that variations of the described embodiments may be made which are still within the scope of the invention.

The invention claimed is:

1. A method for extracting lead from a lead-based material, the method comprising:
    dissolving the lead-based material in a deep eutectic solvent to form an electrolyte;
    providing a working lead electrode in electrical contact with the electrolyte;
    providing a counter electrode in electrical contact with the electrolyte; and
    generating a potential through the electrolyte, thereby reducing a lead species of the lead-based material in the electrolyte at the working lead electrode, so as to deposit the reduced lead species as deposited, reduced lead metal onto the working lead electrode;
    wherein the lead-based material is from a lead acid battery, a lead perovskite photovoltaic and/or lead thermoelectric and comprises $PbO_2$, $PbSO_4$, $CH_3NH_3PbHaI_3$, $HC(NH_2)_2PbHaI_3$, $CH_3NH_3PbI_{3-X}Cl_X$ or PbTe, or a mixture thereof, wherein HaI is I, Cl, or Br, and X is a value between 0 and 3; and
    wherein the deposited, reduced lead metal and the working lead electrode is suitable for direct recycling or reusing as one piece, without need for further processing to separate the lead from the electrode.

2. The method of claim 1, wherein the deep eutectic solvent comprises a hydrogen bond donor and a quaternary ammonium salt.

3. The method of claim 1, wherein the potential applied is equal to, or more negative than, the Pb(II) to Pb reduction potential.

4. The method of claim 1, wherein the deep eutectic solvent is maintained at a temperature above about 20° C.

5. The method of claim 1, wherein the method further comprises:
    dissolving the lead-based material in a deep eutectic solvent to form the electrolyte;
    providing a working electrode in electrical contact with the electrolyte;
    providing a counter electrode in electrical contact with the electrolyte;
    generating a potential through the electrolyte, thereby reducing the lead species of the lead-based material in the electrolyte at the working electrode so as to deposit the reduced lead species on the working electrode as lead metal; and
    collecting the deposited lead metal.

6. The method of claim 1, wherein the counter electrode is an $IrO_2$-coated Ti electrode.

7. The method of claim 1, wherein the method further comprises providing a reference electrode in electrical contact with the electrolyte.

8. The method of claim 1, wherein the lead-based material is dissolved in the deep eutectic solvent at a temperature above about 20° C. to form the electrolyte.

9. An electrochemical cell capable of reducing a lead species in a lead-based material so that the reduced lead species is deposited at a working electrode, the cell comprising:
    an electrolyte comprising a solution of the lead-based material dissolved in a deep eutectic solvent;
    a working lead electrode in electrical contact with the electrolyte; and
    a counter electrode in electrical contact with the electrolyte;
    wherein the lead-based material is from a lead acid battery, a lead perovskite photovoltaic and/or lead thermoelectric and comprises $PbO_2$, $PbSO_4$, $CH_3NH_3PbHaI_3$, $HC(NH_2)_2PbHaI_3$, $CH_3NH_3PbI_{3-X}Cl_X$ or PbTe, or a mixture thereof, wherein HaI is I, Cl, or Br, and X is a value between 0 and 3;
    wherein the reduced lead species is deposited on the working lead electrode; and
    wherein the deposited reduced lead metal adhered to the working lead electrode is suitable for direct recycling or reusing as one piece, without need for further processing to separate the lead from the electrode.

10. The electrochemical cell of claim 9, wherein the counter electrode is an $IrO_2$-coated Ti electrode.

11. The electrochemical cell of claim 9 comprising a reference electrode in electrical contact with the electrolyte.

12. The electrochemical cell of claim 9, wherein the deep eutectic solvent comprises a hydrogen bond donor and a quaternary ammonium salt.

13. The electrochemical cell of claim 9, wherein the electrolyte is maintained a temperature above about 20° C.

14. The electrochemical cell of claim 9, wherein the lead-based material is dissolved in the deep eutectic solvent at a temperature above about 20° C. to form the electrolyte.

15. A method for extracting lead from a lead-based material, the method comprising:
    dissolving the lead-based material from a lead acid battery, a lead perovskite photovoltaic and/or lead thermoelectric in a deep eutectic solvent to form an electrolyte;
    providing a working lead electrode in electrical contact with the electrolyte;
    providing a counter electrode in electrical contact with the electrolyte; and
    generating a potential through the electrolyte, thereby reducing a lead species of the lead-based material in the electrolyte at the working electrode so as to deposit the reduced lead species as lead metal; and
    wherein the deposited reduced lead metal and the working electrode is suitable for direct recycling or reusing as one piece, without need for further processing to separate the lead from the electrode.

16. The method of claim 2, wherein the hydrogen bond donor is ethylene glycol or urea and the quaternary ammonium salt is choline chloride, and wherein the ethylene glycol:choline chloride, or urea:choline chloride are present in a molar ratio of 2:1.

17. The method of claim 1, wherein the reference electrode is an Ag-wire quasi-reference electrode.

18. The electrochemical cell of claim 11, wherein the reference electrode is an Ag-wire quasi-reference electrode.

19. The electrochemical cell of claim 12, wherein the hydrogen bond donor is ethylene glycol or urea and the quaternary ammonium salt is choline chloride, and wherein the ethylene glycol:choline chloride, or urea:choline chloride are present in a molar ratio of 2:1.

* * * * *